US012630931B2

(12) United States Patent
Sone et al.

(10) Patent No.: US 12,630,931 B2
(45) Date of Patent: May 19, 2026

(54) ROUGHENING SOLUTION FOR ROLLED COPPER FOIL AND METHOD FOR PRODUCING ROUGHENED COPPER FOIL

(71) Applicant: MITSUBISHI GAS CHEMICAL COMPANY, INC., Tokyo (JP)

(72) Inventors: Masami Sone, Kanagawa (JP); Hiroshi Matsunaga, Yokkaichi (JP); Satoshi Tamai, Kanagawa (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 18/709,609

(22) PCT Filed: Nov. 15, 2022

(86) PCT No.: PCT/JP2022/042331

§ 371 (c)(1),
(2) Date: May 13, 2024

(87) PCT Pub. No.: WO2023/090306

PCT Pub. Date: May 25, 2023

(65) Prior Publication Data

US 2025/0011940 A1 Jan. 9, 2025

(30) Foreign Application Priority Data

Nov. 18, 2021 (JP) ................................. 2021-187809

(51) Int. Cl.
*C23F 1/18* (2006.01)
*H05K 1/09* (2006.01)
*H05K 1/02* (2006.01)

(52) U.S. Cl.
CPC ................. *C23F 1/18* (2013.01); *H05K 1/09* (2013.01); *H05K 1/0277* (2013.01); *H05K 2201/0355* (2013.01)

(58) Field of Classification Search
CPC .......... C23F 1/18; H05K 1/09; H05K 1/0277; H05K 2201/0355; H05K 3/383
USPC ....................... 438/79.1–79.4; 252/79.1–79.4
See application file for complete search history.

(56) References Cited

U.S. PATENT DOCUMENTS

2012/0319033 A1 12/2012 Okabe et al.

FOREIGN PATENT DOCUMENTS

| | | | | | |
|---|---|---|---|---|---|
| CN | 111349937 | A | | 6/2020 | |
| JP | 2002256459 | A | | 9/2002 | |
| JP | 2008144232 | A | | 6/2008 | |
| JP | 2014013883 | A | * | 1/2014 | |
| KR | 20130080933 | A | * | 7/2013 | ............. C09K 13/06 |
| WO | WO-2011099624 | A1 | | 8/2011 | |
| WO | WO-2012128098 | A1 | | 9/2012 | |
| WO | WO-2012132857 | A1 | | 10/2012 | |
| WO | WO-2019208461 | A1 | * | 10/2019 | ................ C23F 1/18 |

OTHER PUBLICATIONS

International Search Report issued Jan. 24, 2023 in PCT/JP2022/042331, 3 pages.

* cited by examiner

*Primary Examiner* — Duy Vu N Deo
(74) *Attorney, Agent, or Firm* — Element IP, PLC

(57) ABSTRACT

Provided is an aqueous composition for roughening the surface of a rolled copper foil. The aqueous composition contains hydrogen peroxide, sulfuric acid, and an azole compound and/or a salt thereof. Based on the total mass of the aqueous composition, the content of hydrogen peroxide is 0.1 to 5% by mass, the content of sulfuric acid is 0.5 to 15% by mass, and the content of the azole compound is 0.01 to 0.3% by mass. The molar ratio of hydrogen peroxide to sulfuric acid is in the range of 0.1 to 1.0. The azole compound is a benzotriazole compound and/or a tetrazole compound. Also provided are a method for roughening a copper foil using the aqueous composition, a method for producing a roughened copper foil using the aqueous composition, a roughened copper foil, and a flexible printed circuit board using the roughened copper foil.

15 Claims, 1 Drawing Sheet

ROUGHENING SOLUTION FOR ROLLED COPPER FOIL AND METHOD FOR PRODUCING ROUGHENED COPPER FOIL

TECHNICAL FIELD

The present invention relates to a roughening solution for a rolled copper foil, and a method for roughening a copper foil and a method for producing a roughened copper foil each using the roughening solution for a rolled copper foil.

BACKGROUND ART

Rolled copper foils are used for materials for flexible printed circuit boards (FPCs), and in recent years, a surface of a rolled copper foil has been desired to be treated into a particular roughened shape in order to meet high densification, thinning, and fining/fine pitching.

Rolled copper foils are known to be excellent in flexibility, and in order to improve the flexibility, the crystal orientation is controlled so as to allow cube textures after recrystallization annealing to develop. However, it is considered that crystal grains each having a different crystal grain orientation are present locally in the uniform crystal texture and that the etching rate of such a part is different from the etching rate of the periphery and thereby crater-like shapes or pits are formed on the surface of a rolled copper foil after etching (see, for example, Patent Literatures 1 and 2).

Further, from the viewpoint of, for example, improving adhesion to a dry film resist, adhesion to a solder resist, and adhesion to Ni—Au plating, a technique (a roughening solution, a roughening method) to form a particular roughened surface, which is different from roughened surfaces obtained by conventional techniques, has been required in roughening of rolled copper foils. However, it has been difficult to form a particular roughened shape free from the occurrence of a crater-like shape or a pit by conventional techniques.

CITATION LIST

Patent Literature

Patent Literature 1: WO 2012/128098
Patent Literature 2: WO 2012/132857

SUMMARY OF INVENTION

Technical Problem

Under such circumstances, it is required to provide: a roughening solution for a copper foil, which is for producing a copper foil having a roughened surface free from the occurrence of a crater-like shape or a pit and free from treatment unevenness, the roughened surface having particular roughening parameters; a method for roughening a copper foil and a method for producing a roughened copper foil each using the roughening solution for a copper foil; and a roughened copper foil, and a flexible printed circuit board using the roughened copper foil.

Solution to Problem

The present inventors have conducted diligent studies to find that the above problem can be solved by a surface treatment solution (hereinafter, also referred to as "aqueous composition") having a particular composition, wherein hydrogen peroxide (A) and sulfuric acid (B) are blended at a particular molar ratio, and an azole compound (C) and/or a salt thereof is added. Specifically, the present invention includes the following aspects.

<1>

An aqueous composition for roughening a surface of a rolled copper foil, the aqueous composition containing: hydrogen peroxide (A); sulfuric acid (B); and an azole compound (C) and/or a salt thereof, wherein the content of hydrogen peroxide (A) in the aqueous composition is 0.1 to 5% by mass based on the total mass of the aqueous composition, the content of sulfuric acid (B) in the aqueous composition is 0.5 to 15% by mass based on the total mass of the aqueous composition, the content of the azole compound (C) and/or the salt thereof in the aqueous composition is 0.01 to 0.3% by mass based on the total mass of the aqueous composition, a molar ratio between hydrogen peroxide (A) and sulfuric acid (B) in the aqueous composition is in a range of 0.1 to 1.0 expressed by a ratio of hydrogen peroxide/sulfuric acid, and the azole compound (C) is at least one selected from the group consisting of benzotriazole compounds and tetrazole compounds.

<2>

The aqueous composition according to <1>, wherein the azole compound (C) is at least one selected from the group consisting of benzotriazole compounds represented by the following formula (I) and tetrazole compounds represented by the following formula (II):

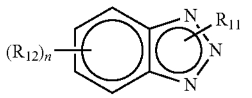

(I)

wherein $R_{11}$ is selected from the group consisting of H (hydrogen), substituted or unsubstituted C1-4 alkyl, hydroxy(C1-4 alkyl), aryl having 20 or less carbon atoms, carboxy, carbonyl, alkoxy having 10 or less carbon atoms, sulfo, phosphine, and nitro, each of $R_{12}$ is independently selected from the group consisting of H (hydrogen), substituted or unsubstituted C1-4 alkyl, hydroxy(C1-4 alkyl), aryl having 20 or less carbon atoms, carboxy, carbonyl, alkoxy having 10 or less carbon atoms, sulfo, phosphine, and nitro, and n is an integer of 1 to 4;

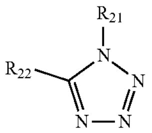

(II)

wherein $R_{21}$ is selected from the group consisting of H (hydrogen), substituted or unsubstituted C1-4 alkyl, hydroxy(C1-4 alkyl), aryl having 20 or less carbon atoms, carboxy, carbonyl, alkoxy having 10 or less carbon atoms, sulfo, phosphine, and nitro, $R_{22}$ is selected from the group consisting of H (hydrogen), substituted or unsubstituted C1-4 alkyl, hydroxy(C1-4 alkyl), aryl having 20 or less carbon atoms, carboxy, carbonyl, alkoxy having 10 or less carbon atoms, sulfo, phosphine, and nitro.

<3>

The aqueous composition according to <2>, wherein the azole compound (C) is at least one selected from the group consisting of 1H-benzotriazole, 5-methylbenzotriazole, 1H-benzotriazole-1-methanol, 5-methyl-1H-tetrazole, and 1H-tetrazole.

<4>

The aqueous composition according to any one of <1> to <3>, further comprising phenylurea, wherein the content of phenylurea in the aqueous composition is 0.005 to 0.3% by mass based on the total mass of the aqueous composition.

<5>

The aqueous composition according to any one of <1> to <4>, wherein when a surface of an untreated rolled copper foil (before roughening treatment) having surface state parameters, Sa, Sz, Sq, Spc, and Sdr, specified by ISO 25178, satisfying the following condition, is subjected to roughening treatment by 0.5 to 1.0 μm expressed in terms of roughening treatment amount (unit: μm) determined by the following formula (1) under a condition of 35° C., an improvement rate (unit: 5) of each parameter, determined by the following formula (2), in the surface state parameters, Sa, Sz, Sq, Spc, and Sdr, for the roughening-treated rolled copper foil is 30% or more for all the surface state parameters:

the surface state parameters of the untreated rolled copper foil (before roughening treatment):

Sa: 0.15±2.0% [μm]
Sz: 2.67±2.0% [μm]
Sq: 0.20±2.0% [μm]
Spc: 1569±2.0% [1/mm]
Sdr: 0.09±2.0% [−];

Roughening treatment amount [μm] = (mass [g] of rolled copper foil before roughening treatment − mass [g] of rolled copper foil after roughening treatment)/(roughening treatment area [m²] × (density of copper) 8.92 [g/cm³]); Formula (1)

Improvement rate [%] = (numerical value of a parameter after roughening treatment − numerical value of a parameter before roughening treatment)/numerical value of a parameter before roughening treatment × 100. Formula (2)

<6>

The aqueous composition according to any one of <1> to <5>, wherein the aqueous composition further contains an alcohol.

<7>

A method for subjecting a rolled copper foil to roughening treatment, the method including bringing the aqueous composition according to any one of <1> to <6> and a surface of the rolled copper foil into contact with each other to roughen the surface of the rolled copper foil.

<8>

The method for subjecting a rolled copper foil to roughening treatment according to <7>, wherein when a surface of the rolled copper foil is subjected to the roughening treatment by 0.5 to 1.0 μm expressed in terms of roughening treatment amount (unit: μm) determined by the following formula (1) under a condition of 35° C., an improvement rate (unit: %) of each parameter, represented by the following formula (2), the improvement rate being a ratio of each numerical value of surface state parameters, Sa, Sz, Sq, Spc, and Sdr, specified by ISO 25178 of the surface of the rolled copper foil after the roughening treatment to each numerical value of surface state parameters, Sa, Sz, Sq, Spc, and Sdr, specified by ISO 25178 of the surface of the rolled copper foil before the roughening treatment, is 30% or more for all the surface state parameters:

Roughening treatment amount [μm] = (mass [g] of rolled copper foil before roughening treatment − mass [g] of rolled copper foil after roughening treatment)/(roughening treatment area [m²] × (density of copper) 8.92 [g/cm³]); Formula (1)

Improvement rate [%] = (numerical value of a parameter after roughening treatment − numerical value of a parameter before roughening treatment)/numerical value of a parameter before roughening treatment × 100. Formula (2)

<9>

A method for producing a roughening-treated rolled copper foil, the method including bringing the aqueous composition according to any one of <1> to <6> and a surface of a rolled copper foil into contact with each other to roughen the surface of the rolled copper foil.

<10>

The method for producing a roughening-treated rolled copper foil according to <9>, wherein when a surface of the rolled copper foil is subjected to the roughening treatment by 0.5 to 1.0 μm expressed in terms of roughening treatment amount (unit: μm) determined by the following formula (1) under a condition of 35° C., an improvement rate (unit: 5) of each parameter, represented by the following formula (2), the improvement rate being a ratio of each numerical value of surface state parameters, Sa, Sz, Sq, Spc, and Sdr, specified by ISO 25178 of the surface of the rolled copper foil after the roughening treatment to each numerical value of surface state parameters, Sa, Sz, Sq, Spc, and Sdr, specified by ISO 25178 of the surface of the rolled copper foil before the roughening treatment, is 30% or more for all the surface state parameters:

Roughening treatment amount [μm] = (mass [g] of rolled copper foil before roughening treatment − mass [g] of rolled copper foil after roughening treatment)/(roughening treatment area [m²] × (density of copper) 8.92 [g/cm³]); Formula (1)

-continued

Improvement rate [%] = Formula (2)

$$\text{(numerical value of a parameter after roughening treatment} - \text{numerical value of a parameter before roughening treatment)} / \text{numerical value of a parameter before roughening treatment} \times 100.$$

<11>

The method for producing a roughening-treated rolled copper foil according to <9> or <10>, wherein the roughening-treated rolled copper foil is a rolled copper foil for a flexible printed circuit board.

<12>

A rolled copper foil obtained by subjecting a surface thereof to roughening treatment using the aqueous composition according to any one of <1> to <6>.

<13>

The rolled copper foil according to <12>, wherein when a surface of the rolled copper foil is subjected to the roughening treatment by 0.5 to 1.0 μm expressed in terms of roughening treatment amount (unit: μm) determined by the following formula (1) under a condition of 35° C., an improvement rate (unit: %) of each parameter, represented by the following formula (2), the improvement rate being a ratio of each numerical value of surface state parameters, Sa, Sz, Sq, Spc, and Sdr, specified by ISO 25178 of the surface of the rolled copper foil after the roughening treatment to each numerical value of surface state parameters, Sa, Sz, Sq, Spc, and Sdr, specified by ISO 25178 of the surface of the rolled copper foil before the roughening treatment, is 30% or more for all the surface state parameters:

Roughening treatment amount [μm] = Formula (1)

$$\text{(mass [g] of rolled copper foil before roughening treatment} - \text{mass [g] of rolled copper foil after roughening treatment)} / (\text{roughening treatment area } [m^2] \times \text{(density of copper)} 8.92\ [g/cm^3]);$$

Improvement rate [%] = Formula (2)

$$\text{(numerical value of a parameter after roughening treatment} - \text{numerical value of a parameter before roughening treatment)} / \text{numerical value of a parameter before roughening treatment} \times 100.$$

<14>

A flexible printed circuit board formed using a roughened copper foil produced by the method according to <9> or <10>.

Advantageous Effects of Invention

According to the present invention, it is possible to obtain a rolled copper foil having a roughened shape free from the occurrence of a crater-like shape or a pit and free from treatment unevenness, the roughened shape being excellent in adhesion to a resin composition which is used for a dry film resist, a solder resist, or the like, adhesion to plating such as Ni—Au plating, or the like, even when etching amount is low. By using the rolled copper foil obtained by the present invention, adhesion to a dry film resist, a solder resist, and the like is improved, and thus a flexible printed circuit board and the like capable of meeting fining/fine pitching can be produced.

DESCRIPTION OF EMBODIMENTS

Figure 1:
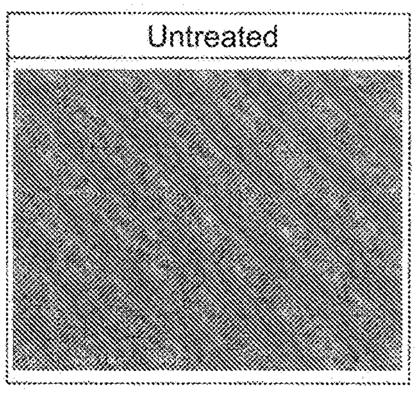
FIG. 1 is a surface observation image of an untreated rolled copper foil taken with a scanning electron microscope (hereinafter, referred to as SEM) (1000× magnification).
Figure 2:
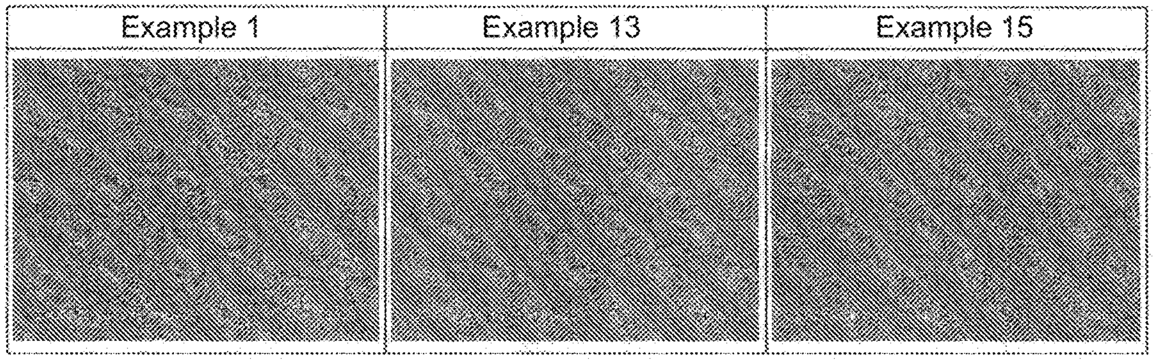
FIG. 2 is a surface observation image of surface-treated rolled copper foils of Examples 1, 13, and 15 taken with SEM (1000× magnification).
Figure 3:
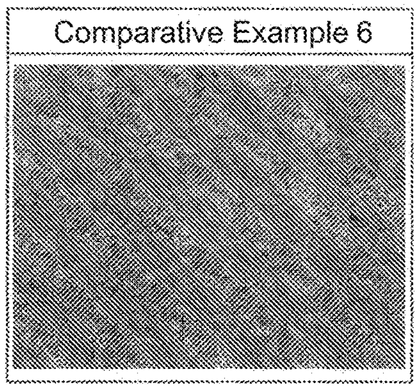
FIG. 3 is a surface observation image of a surface-treated rolled copper foil of Comparative Example 6 taken with SEM (1000× magnification).

1. Surface Treatment Solution for Rolled Copper Foil (Hereinafter, Also Referred to as "Aqueous Composition")

An aqueous composition of the present invention is an aqueous composition for roughening a surface of a copper foil, a rolled copper foil in particular, the aqueous composition containing hydrogen peroxide (A), sulfuric acid (B), and an azole compound (C) and/or a salt thereof.

1.1. Hydrogen Peroxide (A)

In the present invention, hydrogen peroxide (A) is a component that functions as an oxidizing agent for copper.

Hydrogen peroxide (A) which is used in the present invention is not limited and can be a commercially available hydrogen peroxide aqueous solution, and, for example, a 60% grade product for industry/electronics industry manufactured by MITSUBISHI GAS CHEMICAL COMPANY, INC., can suitably be used.

The content of hydrogen peroxide (A) in the aqueous composition is 0.1 to 5% by mass, preferably 0.15 to 3.5% by mass, more preferably 0.2 to 2.5% by mass, particularly preferably 0.3 to 2.0% by mass, based on the total mass of the aqueous composition. When the content of hydrogen peroxide (A) is adjusted in the above range, a favorable surface state of copper and a suitable dissolution rate of copper are obtained.

In addition, the molar ratio between hydrogen peroxide (A) and sulfuric acid (B) is 0.1 to 1.0, preferably 0.15 to 0.9, more preferably 0.2 to 0.7, particularly preferably 0.25 to 0.6, expressed by a ratio of hydrogen peroxide/sulfuric acid. By controlling the molar ratio in this range, a favorable surface state of copper and a suitable dissolution rate of copper are obtained. In addition, a roughened shape of a surface of a rolled copper foil can be made more suitable.

1.2. Sulfuric Acid (B)

In the present invention, sulfuric acid (B) is a component that functions as an etching agent for copper oxidized by hydrogen peroxide (A).

Sulfuric acid (B) which is used in the present invention is not limited, and for example, a 95% sulfuric acid guaranteed reagent manufactured by FUJIFILM Wako Pure Chemical Corporation can suitably be used.

The content of sulfuric acid (B) in the aqueous composition is 0.5 to 15% by mass, preferably 0.6 to 13.0% by mass, more preferably 1.0 to 10.0% by mass, still more preferably 3.0 to 10.0% by mass, based on the total mass of the aqueous composition. By adjusting the content of sulfuric acid (B) in this range, a favorable surface state of copper and suitable dissolution rate of copper are obtained.

1.3. Azole Compound (C) and/or Salt Thereof

In the present invention, the azole compound (C) and/or the salt thereof is a component that is used for densely roughening a surface of a rolled copper foil. Accordingly, by roughening a surface of a copper foil using the aqueous composition containing the azole compound (C) and/or the salt thereof, adhesion of a rolled copper foil to a resin composition which is used for a dry film resist, a solder resist, or the like (hereinafter, also referred to as "resin composition") and adhesion of a rolled copper foil to plating such as Ni—Au plating can be enhanced more.

The azole compound (C) which is used in the present invention is at least one selected from the group consisting of benzotriazole compounds and tetrazole compounds. Specifically, in embodiments of the present invention, the azole compound (C) is a benzotriazole compound, a tetrazole compound, or a mixture of these. In an embodiment of the present invention, the azole compound (C) is a benzotriazole compound. In another embodiment of the present invention, the azole compound (C) is a tetrazole compound. In still another embodiment of the present invention, the azole compound (C) is a mixture of a benzotriazole compound and a tetrazole compound.

1.3.1. Benzotriazole Compound

When the azole compound (C) which is used in the present invention is a benzotriazole compound, the benzotriazole compound may be a compound represented by the following formula (I).

(I)

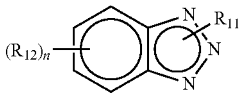

wherein $R_{11}$ is selected from the group consisting of H (hydrogen), substituted or unsubstituted C1-4 alkyl, hydroxy(C1-4 alkyl), aryl having 20 or less carbon atoms, carboxy, carbonyl, alkoxy having 10 or less carbon atoms, sulfo, phosphine, and nitro, each of $R_{12}$ is independently selected from the group consisting of H (hydrogen), substituted or unsubstituted C1-4 alkyl, hydroxy(C1-4 alkyl), aryl having 20 or less carbon atoms, carboxy, carbonyl, alkoxy having 10 or less carbon atoms, sulfo, phosphine, and nitro, and n is an integer of 1 to 4.

In the benzotriazole compound which is used in the present invention, $R_{11}$ is preferably selected from the group consisting of H (hydrogen), substituted or unsubstituted C1-4 alkyl, hydroxy(C1-4 alkyl), and aryl having 20 or less carbon atoms, more preferably selected from the group consisting of H, methyl, ethyl, n-propyl, sec-propyl, n-butyl, sec-butyl, tert-butyl, hydroxymethyl, hydroxyethyl, n-hydroxypropyl, sec-hydroxypropyl, n-hydroxybutyl, sec-hydroxybutyl, tert-hydroxybutyl, phenyl, tolyl, xylyl, and hydroxyphenyl, and still more preferably selected from the group consisting of H, methyl, hydroxymethyl, phenyl, tolyl, xylyl, and hydroxyphenyl.

In the benzotriazole compound which is used in the present invention, each of $R_{12}$ is preferably independently selected from the group consisting of H (hydrogen), substituted or unsubstituted C1-4 alkyl, hydroxy(C1-4 alkyl), and aryl having 20 or less carbon atoms, more preferably independently selected from the group consisting of H, methyl, ethyl, n-propyl, sec-propyl, n-butyl, sec-butyl, tert-butyl, hydroxymethyl, n-hydroxypropyl, sec-hydroxypropyl, n-hydroxybutyl, sec-hydroxybutyl, tert-hydroxybutyl, phenyl, tolyl, xylyl, and hydroxyphenyl, and still more preferably selected from the group consisting of H, methyl, hydroxymethyl, phenyl, tolyl, xylyl, and hydroxyphenyl.

In the benzotriazole compound which is used in the present invention, n is preferably an integer of 1 to 3, more preferably an integer of 1 to 2, and still more preferably 1.

The benzotriazole compound which can be used in the present invention may be, for example, 1H-benzotriazole, 5-methyl-1H-benzotriazole, 1H-benzotriazole-1-methanol, or the like, but is not limited to these. In an embodiment of the present invention, the benzotriazole compound is one or more selected from the group consisting of 1H-benzotriazole, 5-methyl-1H-benzotriazole, and 1H-benzotriazole-1-methanol.

1.3.2. Tetrazole Compound

When the azole compound (C) which is used in the present invention is a tetrazole compound, the tetrazole compound may be a compound represented by the following formula (II).

(II)

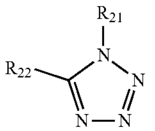

wherein $R_{21}$ is selected from the group consisting of H (hydrogen), substituted or unsubstituted C1-4 alkyl, hydroxy(C1-4 alkyl), aryl having 20 or less carbon atoms, carboxy, carbonyl, alkoxy having 10 or less carbon atoms, sulfo, phosphine, and nitro, $R_{22}$ is selected from the group consisting of H (hydrogen), substituted or unsubstituted C1-4 alkyl, hydroxy(C1-4 alkyl), aryl having 20 or less carbon atoms, carboxy, carbonyl, alkoxy having 10 or less carbon atoms, sulfo, phosphine, and nitro.

In the tetrazole compound which is used in the present invention, $R_{21}$ is preferably selected from the group consisting of H (hydrogen), substituted or unsubstituted C1-4 alkyl, hydroxy(C1-4 alkyl), and aryl having 20 or less carbon atoms, more preferably selected from the group consisting of H, methyl, ethyl, n-propyl, sec-propyl, n-butyl, sec-butyl, tert-butyl, n-hydroxypropyl, sec-hydroxypropyl, n-hydroxybutyl, sec-hydroxybutyl, tert-hydroxybutyl, phenyl, tolyl, xylyl, and hydroxyphenyl, and still more preferably selected from the group consisting of H, methyl, hydroxymethyl, phenyl, tolyl, xylyl, and hydroxyphenyl.

In the tetrazole compound which is used in the present invention, $R_{22}$ is preferably selected from the group consisting of H (hydrogen), substituted or unsubstituted C1-4 alkyl, hydroxy(C1-4 alkyl), and aryl having 20 or less carbon atoms, more preferably selected from the group consisting of H, methyl, ethyl, n-propyl, sec-propyl, n-butyl, sec-butyl, tert-butyl, n-hydroxypropyl, sec-hydroxypropyl, n-hydroxybutyl, sec-hydroxybutyl, tert-hydroxybutyl, phenyl, tolyl, xylyl, and hydroxyphenyl, and still more preferably selected from the group consisting of H, methyl, hydroxymethyl, phenyl, tolyl, xylyl, and hydroxyphenyl.

The tetrazole compound which can be used in the present invention may be, for example, 1H-tetrazole, 1-methyl-1H- tetrazole, 1-ethyl-1H-tetrazole, 5-methyl-1H-tetrazole, 5-ethyl-1H-tetrazole, 5-n-propyl-1H-tetrazole, 1-methyl-5-ethyl-1H-tetrazole, 1-ethyl-5-methyl-1H-tetrazole, 1-isopropyl-5-methyl-1H-tetrazole, 5-phenyl-1H-tetrazole, or the like, although not limited thereto. In an embodiment of the present invention, the tetrazole compound is preferably one or more selected from the group consisting of 1H-tetrazole and 5-methyl-1H-tetrazole.

In an embodiment of the present invention, the azole compound (C) is at least one selected from the group consisting of 1H-benzotriazole, 5-methylbenzotriazole, 1H-benzotriazole-1-methanol, 5-methyl-1H-tetrazole, and 1H-tetrazole.

1.3.3. Salt of Azole Compound (C)

Examples of the salt of the azole compound (C) include, but not limited to, a nitric acid salt and a sulfuric acid salt.

1.3.4. Content of Azole Compound (C) and/or Salt Thereof

In the present invention, a person skilled in the art can appropriately adjust the content of the azole compound (C) and/or the salt thereof in the aqueous composition based on a desired etching rate of a copper foil or a desired roughened shape of a copper foil. In the present invention, the content of the azole compound (C) and/or the salt thereof in the aqueous composition is 0.01 to 0.35 by mass, may preferably be 0.02 to 0.251 by mass, and may more preferably be 0.03 to 0.20% by mass, based on the total mass of the aqueous composition.

1.4. Additional Components 1.4.1. Alcohol

The aqueous composition of the present invention may further contain an alcohol as an optional component.

The alcohol in the present invention includes all of general alcohols and is a component that can suppress treatment unevenness on a surface of a rolled copper foil during roughening treatment.

Specific examples of the alcohol include

- monohydric alcohols, such as methanol, ethanol, propanol, and 2-(2-butoxyethoxy)ethanol;
- dihydric alcohols, such as ethylene glycol, propylene glycol, 1,4-butanediol, and 1,5-pentanediol;
- trihydric or higher alcohols; and
- glycol ethers, such as polyethylene glycol. The alcohol may be used singly, or two or more of these can be used together.

The concentration of the alcohol in the aqueous composition is 0.1 to 5.0% by mass, preferably 0.5 to 5.0% by mass. When the concentration of the alcohol is within this range, thereby an effect of suppressing treatment unevenness can be obtained without inhibiting formation of a particular roughened shape of a rolled copper foil.

In an embodiment of the present invention, the aqueous composition further contains an alcohol. Specifically, in this embodiment, the aqueous composition contains hydrogen peroxide (A), sulfuric acid (B), an azole compound (C) and/or a salt thereof, and an alcohol.

1.4.2. Phenylurea

The aqueous composition of the present invention may appropriately contain phenylurea as an optional component.

Phenylurea in the present invention is a component that improves stability of hydrogen peroxide (A).

Phenylurea which is used in the present invention is not limited, and for example, phenylurea manufactured by FUJIFILM Wako Pure Chemical Corporation can suitably be used.

The content of phenylurea in the aqueous composition is preferably 0.005 to 0.3% by mass, more preferably 0.005 to 0.15% by mass, still more preferably 0.005 to 0.1% by mass, based on the total mass of the aqueous composition. By adjusting the concentration of phenylurea in this range, decomposition of hydrogen peroxide (A) can be suppressed. In addition, by appropriately adjusting the ratio of the amount of phenylurea, a particular roughened shape on a surface of a rolled copper foil can be made more suitable.

In an embodiment of the present invention, the aqueous composition contains hydrogen peroxide (A), sulfuric acid (B), an azole compound (C) and/or a salt thereof, and phenylurea. In an embodiment of the present invention, the aqueous composition contains hydrogen peroxide (A), sulfuric acid (B), an azole compound (C) and/or a salt thereof, and phenylurea, and the content of phenylurea in the aqueous composition is 0.005 to 0.3% by mass based on the total mass of the aqueous composition.

In another embodiment of the present invention, the aqueous composition contains hydrogen peroxide (A), sulfuric acid (B), an azole compound (C) and/or a salt thereof, phenyl urea, and an alcohol.

1.4.3. Additives

The aqueous composition of the present invention may appropriately contain, as optional components, various types of additives which are used usually in a range where the effects of the present invention are not impaired.

For example, known etching rate adjusting agents, such as an alkali, an organic carboxylic acid, a surfactant, and a defoamer; a copper ion supply source for stabilizing the etching rate; and cyclohexylamine for stabilizing the etching rate at the time when a chloride ion are mixed may be used as the additives as necessary.

1.4.4. Water

Water to be used for the aqueous composition of the present invention is preferably water obtained by removing metal ions, organic impurities, particles, and the like by distillation, ion-exchange treatment, filter treatment, and various types of adsorption treatment, or the like, more preferably pure water, particularly preferably ultrapure water.

1.4.5. Metal Ion Other Than Copper

The aqueous composition of the present invention is preferably free from a metal ion other than copper. Examples of the metal ion other than copper include a silver ion, a gold ion, and palladium ion. Such metal ions can be used in producing an electrolytic copper foil but need not to be used in producing a roughened shape of a rolled copper foil of the present invention.

1.4.6. Halide Ion

The aqueous composition of the present invention is preferably substantially free from a halide ion. In the present invention, the halide ion refers to one or more ions selected from the group consisting of a fluoride ion, a chloride ion, a bromide ion, and an iodide ion.

The content of the halide ion which can be contained in the aqueous composition of the present invention is preferably 0.3 ppm or less.

When the aqueous composition of the present invention is substantially free from a halide ion, thereby it is made possible to produce a rolled copper foil having a roughened surface free from the occurrence of a crater-like shape or a pit and having particular roughening parameters.

1.5. Preparation of Aqueous Composition

The aqueous composition of the present invention is prepared by uniformly stirring hydrogen peroxide (A), sulfuric acid (B), and the azole compound (C) and/or the salt thereof, and other components which are added as necessary.

1.6. Properties of Aqueous Composition

Use of the aqueous composition of the present invention makes it possible to produce a rolled copper foil having a roughened surface free from the occurrence of a crater-like shape or a pit and having particular roughening parameters. In the present invention, the above-described particular roughening parameters refer to parameters (hereinafter, also referred to as "surface state parameters") that are specified by ISO 25178 and specify a surface state. These surface state parameters will be described later.

In an embodiment of the present invention, there is provided the aqueous composition, wherein when a surface of an untreated rolled copper foil (before roughening treatment) having surface state parameters, Sa, Sz, Sq, Spc, and Sdr, specified by ISO 25178, satisfying the following condition, is subjected to roughening treatment by 0.5 to 1.0 μm expressed in terms of roughening treatment amount (unit: μm) determined by the following formula (1) under a condition of 35° C., an improvement rate (unit: %) of each parameter, determined by the following formula (2), in the surface state parameters, Sa, Sz, Sq, Spc, and Sdr, for the roughening-treated rolled copper foil is 30% or more for all the surface state parameters.

The surface state parameters of the untreated rolled copper foil (before roughening treatment):

Sa: 0.15±2.0% [μm]
Sz: 2.67±2.0% [μm]
Sq: 0.20±2.0% [μm]
Spc: 1569±2.0% [1/mm]
Sdr: 0.09±2.0% [−]

$$\text{Roughening treatment amount } [\mu m] = (\text{mass } [g] \text{ of rolled copper foil before roughening treatment} - \text{mass } [g] \text{ of rolled copper foil after roughening treatment}) / (\text{roughening treatment area } [m^2] \times \langle\text{density of copper}\rangle 8.92\ [g/cm^3]) \quad \text{Formula (1)}$$

$$\text{Improvement rate } [\%] = (\text{numerical value of a parameter after roughening treatment} - \text{numerical value of a parameter before roughening treatment}) / \text{numerical value of a parameter before roughening treatment} \times 100 \quad \text{Formula (2)}$$

2. Method for Subjecting Rolled Copper Foil to Roughening Treatment

In the present invention, a surface of a rolled copper foil can be subjected to roughening treatment by bringing the aqueous composition and the surface of the rolled copper foil into contact with each other to dissolve the surface of the rolled copper foil. According to a preferred aspect of the present invention, when a surface of a rolled copper foil is subjected to roughening treatment using the aqueous composition, thereby the roughening shape of the surface of the rolled copper foil can be made suitable. The method of bringing the aqueous composition and a surface of a rolled copper foil is not particularly limited, and a known method such as immersion and spraying can be adopted.

In addition, the aqueous composition of the present invention can be used in known methods for subjecting a rolled copper foil to surface treatment, such as batch-type surface treatment and sheet-fed-type surface treatment. The rolled copper foil which is used in the present invention is a generally known rolled copper foil and is a copper foil produced by subjecting an ingot of copper or copper alloy to plastic processing and thermal treatment with a mill roll repeatedly, the copper foil having flexibility and high crystal orientation.

Service temperature of the aqueous composition is not limited but is usually 20 to 50° C., preferably 25 to 40° C., more preferably 25 to 35° C. The dissolution rate of copper becomes faster as the service temperature of the aqueous composition increases, but the temperature exceeding 50° C. is not preferable because decomposition of hydrogen peroxide is vigorous.

In addition, the time of bringing the aqueous composition and the surface of the rolled copper foil with each other (also referred to as "etching time") is not limited but is usually 1 to 600 seconds, preferably 5 to 300 seconds, more preferably 10 to 180 seconds, particularly preferably 15 to 120 seconds.

Furthermore, the dissolution rate of the surface of the rolled copper foil with the aqueous composition is not limited, but the etching rate (E/R) under a treatment condition of, for example, 35° C. is usually 0.2 to 4.0 μm/minute, preferably 0.25 to 3.0 μm/minute, and the etching rate (E/R) under such a condition is particularly preferably 0.3 to 1.0 μm/minute because the surface state of the rolled copper foil after the roughening treatment is made so as to fall within a suitable range, and the etching time can be shortened.

The etching amount (also referred to as "roughening treatment amount") of the rolled copper foil in the roughening treatment is preferably 1.0 μm or less, more preferably 0.1 to 1.0 μm, still more preferably 0.2 to 1.0 μm, most preferably 0.5 to 1.0 μm. Generally, the degree of roughening is increased according to the etching amount, but in the roughening treatment method of the present invention, adhesion to a resin composition which is used for a dry film resist, a solder resist, or the like, and adhesion to plating, such as Ni—Au plating, can be improved even when the etching amount is low.

Here, the etching amount of a rolled copper foil refers to a value represented by the following formula (3).

$$\text{Etching amount } [\mu m] = (\text{mass of copper foil before etching} - \text{mass of copper foil after etching}) / (\text{etching area} \times \text{density of copper}) \quad (3)$$

wherein the density of copper is 8.92 $g/cm^3$.

Note that the "etching amount" in the present invention refers to the average depth of the whole surface of an etching-treated copper foil instead of the depth of individual parts of the etching-treated copper foil.

The thickness of the rolled copper foil that is an object of the roughening treatment is not particularly limited but is preferably 3 to 35 μm, more preferably 5 to 30 μm. When the thickness of the rolled copper foil is in this range, handling properties of the rolled coper foil is favorable.

In the rolled copper foil on which a resin composition layer, such as a dry film resist or a solder resist, is to be laminated, a roughening-treated surface, which is on the side where the surface comes into contact with the resin composition, is preferably untreated with a metal other than copper, a silane coupling agent, or an adhesive (primer). The same applies to a roughening-treated surface, which is on the side where the surface comes into contact with plating, such as Ni—Au plating. The surface of the rolled copper foil subjected to roughening treatment by the roughening treatment method of the present invention is densely roughened. For this reason, the rolled copper foil subjected to roughening treatment by the roughening treatment method of the present invention can strongly adhere to the resin composition without being subjected to surface treatment with a metal other than copper, a silane coupling agent, an adhesive, or the like.

In an embodiment of the present invention, there is provided a method for subjecting a rolled copper foil to roughening treatment including bringing the above-described aqueous composition and a surface of the rolled copper foil into contact with each other to roughen the surface of the rolled copper foil.

By subjecting a surface of a rolled copper foil to roughening treatment using the aqueous composition of the present invention, it is made possible to produce a rolled copper foil having a roughened surface free from the occurrence of a crater-like shape or a pit and having particular roughening parameters. In the present invention, the above-described particular roughening parameters refer to parameters that are specified by ISO 25178 and specify a surface state. These parameters will be described later.

In an embodiment of the present invention, there is provided the method for subjecting a rolled copper foil to roughening treatment, wherein when a surface of the rolled copper foil is subjected to the roughening treatment by 0.5 to 1.0 μm expressed in terms of roughening treatment amount (unit: μm) determined by the following formula (1) under a condition of 35° C., an improvement rate (unit: %) of each parameter, determined by the following formula (2), the improvement rate being a ratio of each numerical value of surface state parameters, Sa, Sz, Sq, Spc, and Sdr, specified by ISO 25178 of the surface of the rolled copper foil after the roughening treatment to each numerical value of surface state parameters, Sa, Sz, Sq, Spc, and Sdr, specified by ISO 25178 of the surface of the rolled copper foil before the roughening treatment, is 30% or more for all the surface state parameters.

$$\text{Roughening treatment amount [μm]} = (\text{mass [g] of rolled copper foil before roughening treatment} - \text{mass [g] of rolled copper foil after roughening treatment}) / (\text{roughening treatment area } [m^2] \times \langle\text{density of copper}\rangle 8.92\ [g/cm^3]) \quad \text{Formula (1)}$$

$$\text{Improvement rate [\%]} = (\text{numerical value of a parameter after roughening treatment} - \text{numerical value of a parameter before roughening treatment}) / \text{numerical value of a parameter before roughening treatment} \times 100 \quad \text{Formula (2)}$$

3. Method for Producing Roughening-Treated Rolled Copper Foil

In an embodiment of the present invention, there is provided a method for producing a roughening-treated rolled copper foil, the method including bringing the above-described aqueous composition and a surface of a rolled copper foil into contact with each other to roughen the surface of the rolled copper foil. The method for subjecting a rolled copper foil to roughening treatment is as described above.

By carrying out the method for producing a roughening-treated rolled copper foil, the method including subjecting a rolled copper foil to roughening treatment using the aqueous composition of the present invention, it is made possible to produce a rolled copper foil having a roughened surface free from the occurrence of a crater-like shape or a pit and having particular roughening parameters. In the present invention, the above-described particular roughening parameters refer to parameters that are specified by ISO 25178 and specify a surface state. These parameters will be described later.

In an embodiment of the present invention, there is provided the method for producing a roughening-treated rolled copper foil, wherein when a surface of the rolled copper foil is subjected to the roughening treatment by 0.5 to 1.0 μm expressed in terms of roughening treatment amount (unit: μm) determined by the following formula (1) under a condition of 35° C., an improvement rate (unit: %) of each parameter, determined by the following formula (2), the improvement rate being a ratio of each numerical value of surface state parameters, Sa, Sz, Sq, Spc, and Sdr, specified by ISO 25178 of the surface of the rolled copper foil after the roughening treatment to each numerical value of surface state parameters, Sa, Sz, Sq, Spc, and Sdr, specified by ISO 25178 of the surface of the rolled copper foil before the roughening treatment, is 30% or more for all the surface state parameters.

$$\text{Roughening treatment amount [μm]} = (\text{mass [g] of rolled copper foil before roughening treatment} - \text{mass [g] of rolled copper foil after roughening treatment}) / (\text{roughening treatment area } [m^2] \times \langle\text{density of copper}\rangle 8.92\ [g/cm^3]) \quad \text{Formula (1)}$$

$$\text{Improvement rate [\%]} = (\text{numerical value of a parameter after roughening treatment} - \text{numerical value of a parameter before roughening treatment}) / \text{numerical value of a parameter before roughening treatment} \times 100 \quad \text{Formula (2)}$$

In the present invention, the roughening-treated rolled copper foil may be a rolled copper foil for a flexible printed circuit board. In an embodiment of the present invention, there is provided the method for producing a roughening-treated rolled copper foil, wherein the roughening-treated rolled copper foil is a rolled copper foil for a flexible printed circuit board.

4. Physical Properties of Roughening-Treated Rolled Copper Foil

By the above-described method for producing a roughening-treated rolled copper foil, a rolled copper foil having a surface treated into a particular roughened shape can be obtained. In an embodiment of the present invention, there is provided a rolled copper foil obtained by subjecting a surface thereof to roughening treatment using the above-described aqueous composition.

4.1. Surface State Parameters

In an embodiment of the present invention, the roughening-treated rolled copper foil is such that when a surface of an untreated rolled copper foil (before roughening treatment) having surface state parameters, Sa, Sz, Sq, Spc, and Sdr, specified by ISO 25178, satisfying the following condition, is subjected to roughening treatment by 0.5 to 1.0 μm expressed in terms of roughening treatment amount (unit: μm) determined by the following formula (1) under a condition of 35° C., an improvement rate (unit: %) of each parameter, determined by the following formula (2), in the surface state parameters, Sa, Sz, Sq, Spc, and Sdr, for the roughening-treated rolled copper foil is 30% or more for all the surface state parameters.

The surface state parameters of the untreated rolled copper foil (before roughening treatment):

Sa: 0.15±2.0% [μm]
Sz: 2.67±2.0% [μm]
Sq: 0.20±2.0% [μm]
Spc: 1569±2.0% [1/mm]
Sdr: 0.09±2.0% [−]

$$\text{Roughening treatment amount [μm]} = \text{(mass [g] of rolled copper foil before roughening treatment} - \text{mass [g] of rolled copper foil after roughening treatment)} / (\text{roughening treatment area } [m^2] \times \langle\text{density of copper}\rangle 8.92\ [g/cm^3]) \quad \text{Formula (1)}$$

$$\text{Improvement rate [\%]} = \text{(numerical value of a parameter after roughening treatment} - \text{numerical value of a parameter before roughening treatment)/numerical value of a parameter before roughening treatment} \times 100 \quad \text{Formula (2)}$$

A surface state parameter Sa [μm] represents arithmetical mean height. Sa is a parameter obtained by extending Ra (arithmetical mean height of a line) to a surface and represents the mean of absolute values of differences in height of each point with respect to the mean plane of a surface. Sa is one of parameters generally utilized in evaluating surface roughness. In the embodiments of the present invention, Sa of the untreated rolled copper foil (before the roughening treatment) is preferably 0.15±2.0% [μm]. In the present invention, Sa after the roughening treatment is preferably larger than Sa before the roughening treatment. In a preferred embodiment of the present invention, when the roughening treatment is performed by 0.5 to 1.0 μm expressed in terms of roughening treatment amount (unit: μm) determined by the above formula (1) under a condition of 35° C., the improvement rate of Sa after the roughening treatment as compared to Sa before the roughening treatment, determined by the above formula (2) is 30% or more, preferably 40, or more, more preferably 50% or more.

A surface state parameter Sz [μm] represents maximum height. Sz represents a distance from the highest point to the lowest point in the surface. Sz is also one of parameters generally utilized in evaluating surface roughness. In the embodiments of the present invention, Sz of the untreated rolled copper foil (before the roughening treatment) is preferably 2.67±2.0% [μm]. In the present invention, Sz after the roughening treatment is preferably larger than Sz before the roughening treatment. In a preferred embodiment of the present invention, when the roughening treatment is performed by 0.5 to 1.0 μm expressed in terms of roughening treatment amount (unit: μm) determined by the above formula (1) under a condition of 35° C., the improvement rate of Sz after the roughening treatment as compared to Sz before the roughening treatment, determined by the above formula (2) is 30% or more, preferably 40% or more, more preferably 50% or more.

A surface state parameter Sq [μm] is one of the parameters that represent height and represents a root mean square height. Sq is a parameter corresponding to standard deviation of distances from the mean plane (namely, heights). In the embodiments of the present invention, Sq of the untreated rolled copper foil (before the roughening treatment) is preferably 0.20±2.0% [μm]. In the present invention, Sq after the roughening treatment is preferably larger than Sq before the roughening treatment. In a preferred embodiment of the present invention, when the roughening treatment is performed by 0.5 to 1.0 μm expressed in terms of roughening treatment amount (unit: μm) determined by the above formula (1) under a condition of 35° C., the improvement rate of Sq after the roughening treatment as compared to Sq before the roughening treatment, determined by the above formula (2) is 30% or more, preferably 40% or more, more preferably 50% or more. When the improvement rate of Sq after the roughening treatment as compared to Sq before the roughening treatment is in the above-described range, a surface suitable for improving adhesion to a resin composition or plating can be obtained.

A surface state parameter Spc [1/mm] is one of the parameters that represent a configuration and represents an arithmetic mean peak curvature. Spc represents the mean of principal curvatures of the peaks in a surface. Small Spc indicates that points to be in contact with another object are rounded, while large Spc indicates that the points to be in contact with another object are sharp. In the embodiments of the present invention, Spc of the untreated rolled copper foil (before the roughening treatment) is preferably 1569±2.0% [1/mm]. In the present invention, Spc after the roughening treatment is preferably larger than Spc before the roughening treatment. In a preferred embodiment of the present invention, when the roughening treatment is performed by 0.5 to 1.0 μm expressed in terms of roughening treatment amount (unit: μm) determined by the above formula (1) under a condition of 35° C., the improvement rate of Spc after the roughening treatment as compared to Spc before the roughening treatment, determined by the above formula (2) is 30% or more, preferably 40% or more, more preferably 50% or more, still more preferably 100% or more, further more preferably 200'% or more. When the improvement rate of Spc after the roughening treatment as compared to Spc before the roughening treatment is in the above-described range, a surface suitable for improving adhesion to a resin composition or plating can be obtained.

A surface state parameter Sdr [−] is one of the combined parameters and represents a developed interfacial area ratio. Sdr represents to what extent the developed area (surface area) of a defined region increases compared to the area of the defined region. When a surface is a perfectly flat plane, Sdr is 0, while a surface has a slope, Sdr is larger. In the embodiments of the present invention, Sdr of the untreated rolled copper foil (before the roughening treatment) is preferably 0.09±2.0% [−]. In the present invention, Sdr after the roughening treatment is preferably larger than Sdr before the roughening treatment. In a preferred embodiment of the present invention, when the roughening treatment is performed by 0.5 to 1.0 μm expressed in terms of roughening treatment amount (unit: μm) determined by the above formula (1) under a condition of 35° C., the improvement rate of Sdr after the roughening treatment as compared to Sdr before the roughening treatment, determined by the above formula (2) is 30% or more, preferably 40% or more, more preferably 50% or more, still more preferably 300% or more, further more preferably 500% or more. When the improvement rate of Sdr after the roughening treatment as compared to Sdr before the roughening treatment is in the above-described range, a surface suitable for improving adhesion to a resin composition or plating can be obtained.

In a preferred embodiment of the present invention, when the roughening treatment is performed by 0.5 to 1.0 μm expressed in terms of roughening treatment amount (unit: μm) determined by the above formula (1) under a condition of 35° C., the improvement rate (unit: %) of each parameter, determined by the above formula (2), in the surface state parameters, Sa, Sz, Sq, Spc, and Sdr, for the roughening-treated rolled copper foil is 30% or more for all the surface state parameters. In addition, the surface state parameters Sq, Spc, and Sdr are preferably improved with a good balance after the roughening treatment, as compared to those before the roughening treatment. When the surface parameters Sq, Spc, and Sdr are improved with a good balance, thereby a surface suitable for improving adhesion to a resin composition or plating can be formed.

The surface state parameters can be measured by observation with a laser microscope. In the embodiments of the present invention, the surface state parameters that indicate a surface state of a rolled copper foil are measured by measuring a range of 234.89×186.25 mm using a laser microscope (VK-X200/250 manufactured by KEYENCE CORPORATION, lens: CF Plan Apo 50×).

4.2. Observation with Scanning Electron Microscope (Also Referred to as "SEM")

Whether or not a crater-like shape or a pit is formed on a surface of a rolled copper foil, specifically whether or not grain boundary etching is formed, can be checked by observation with a scanning electron microscope (SEM). In the embodiments of the present invention, the surface states of rolled copper foils are observed using a scanning electron microscope (SEM: S-3400N manufactured by Hitachi High-Technologies Corporation) under conditions of an acceleration voltage of 5 kV, a current of 30 mA, and 1000× magnification.

5. Flexible Printed Circuit Board

By using a roughened copper foil produced by the method for producing a rolled copper foil of the present invention, a flexible printed circuit board can be formed. Specifically, in an embodiment of the present invention, there is provided a flexible printed circuit board formed using a roughened copper foil produced by the method for producing a rolled copper foil of the present invention.

According to a preferred aspect of the present invention, the rolled copper foil of the present invention having been subjected to surface treatment using the above-described aqueous composition has a surface whose roughed shape is suitable, and therefore the rolled copper foil can improve adhesin to a resin composition for a dry film resist, a solder resist, or the like, adhesion to plating, such as Ni—Au plating, and the like, and can suitably be used for a flexible printed circuit board, and the like. In addition, the method for subjecting a rolled copper foil to roughening treatment of the present invention can also suitably be used for not only pretreatment for a dry film resist and pretreatment for a solder resist, and pretreatment for Ni—Au plating but also various types of pretreatment in flexible printed circuit board production processes. Examples of the pretreatment include pretreatment in electroless copper plating and pretreatment in electroplating.

EXAMPLES

Example 1

(1) Preparation of Aqueous Composition

An aqueous composition was prepared by weighing out 1.67 g of hydrogen peroxide (A) (60% hydrogen peroxide manufactured by MITSUBISHI GAS CHEMICAL COMPANY, INC.), 7.89 g of sulfuric acid (B) (95% guaranteed reagent manufactured by FUJIFILM Wako Pure Chemical Corporation), 5.10 g of an alcohol (propylene glycol (guaranteed reagent) manufactured by FUJIFILM Wako Pure Chemical Corporation), 0.1 g of the azole compound (C) and/or the salt thereof (1H-benzotriazole (Wako Special Grade)), 0.04 g of phenylurea (manufactured by FUJIFILM Wako Pure Chemical Corporation), and 7.86 g of Copper(II) sulfate pentahydrate (manufactured by FUJIFILM Wako Pure Chemical Corporation), further adding ultrapure water so as to make the total mass 200 g, and stirring the resultant mixture until the mixture became uniform.

(2) Surface Treatment Using Aqueous Composition

A laminate (manufactured by Arisawa Mfg. Co., Ltd.) obtained by laminating a rolled copper foil HA-V2 foil (manufactured by JX Metals Corporation) on one surface of a polyimide film was prepared and cut into a 30 mm square.

The laminate with a rolled copper foil, cut into a 30 mm square, was subjected to etching treatment (roughening treatment) in such a way that the roughening treatment amount of the rolled copper foil, determined by the following formula (1), was 0.5 μm by spray treatment using a full-cone nozzle INJJX010 (manufactured by H. IKEUCHI & CO., LTD.) as a spray nozzle and setting the spray pressure to 0.05 MPa and the liquid temperature of the aqueous composition to 35° C.

$$\text{Roughening treatment amount } [\mu\text{m}] = (\text{mass [g] of rolled copper foil before roughening treatment} - \text{mass [g] of rolled copper foil after roughening treatment}) / (\text{roughening treatment area } [\text{m}^2] \times \langle\text{density of copper}\rangle 8.92\ [\text{g/cm}^3]) \quad \text{Formula (1)}$$

(3) Measurement of Surface State Parameters

Parameters Sa, Sz, Sq, Spc, and Sdr that are specified by ISO 25178 and which specify a surface state were measured for the rolled copper foil of the laminate with a rolled copper foil (before roughening treatment) used for the surface treatment in (2) above and the rolled copper foil of the laminate with a rolled copper foil after the roughening treatment to calculate the improvement rate (unit: %) of each surface state parameter, determined by the following formula (2) to evaluate the surface state parameter improvement rate. Criteria for evaluation of a surface state parameter improvement rate are as follows. Results are shown in Table 2 and Table 4.

Improvement rate [%] = Formula (2)

$$\text{(numerical value of a parameter after roughening treatment} - \text{numerical value of a parameter before roughening treatment)/numerical value of a parameter before roughening treatment} \times 100$$

<Criteria for Evaluation of Surface State Parameter Improvement Rate>

[Sa, Sz, Sq]

A: The improvement rate is 50% or more

B: The improvement rate is 40% or more and less than 50%

C: The improvement rate is 30% or more and less than 40%

D: The improvement rate is less than 30%

Note that A to C are acceptable, and the larger the numerical value is, the better the improvement rate is.

[Spc]

A: The improvement rate is 200% or more

B: The improvement rate is 100% or more and less than 200%

C: The improvement rate is 30% or more and less than 100%

D: The improvement rate is less than 30%

Note that A to C are acceptable, and the larger the numerical value is, the better the improvement rate is.

[Sdr]

A: The improvement rate is 500% or more

B: The improvement rate is 300% or more and less than 500%

C: The improvement rate is 30% or more and less than 300%

D: The improvement rate is less than 30'.

Note that A to C are acceptable, and the larger the numerical value is, the better the improvement rate is.

<Surface State Parameters of Rolled Copper Foil before Roughening Treatment>

The surface state parameters of the rolled copper foil in the laminate with a rolled copper foil before the roughening treatment were as follows.

Sa (unit: µm): 0.15

Sz (unit: µm): 2.67

Sq (unit: µm): 0.20

Spc (unit: 1/mm): 1569

Sdr (unit: −): 0.09

(4) Observation (Evaluation of Surface State) with Scanning Electron Microscope (SEM)

The surface state of the rolled copper foil was measured for the rolled copper foil of the laminate with a rolled copper foil (before roughening treatment) used for the surface treatment in (2) above and the rolled copper foil of the laminate with a rolled copper foil after the roughening treatment using a scanning electron microscope (SEM: S-3400N manufactured by Hitachi High-Technologies Corporation) under conditions of an acceleration voltage of 5 kV, and 1000× magnification. Whether or not a crater-like shape or a pit was not formed on the surfaces of the rolled copper foils was observed by the observation with a scanning electron microscope (SEM).

When neither a crater-like shape nor a pit was formed on a surface of a rolled copper foil in an SEM image, the surface was regarded as one free from grain boundary etching.

Criteria for evaluation of a surface state are as follows. Results are shown in Table 2 and Table 4.

<Criteria for Evaluation of Surface State>

Surface where grain boundary etching did not occur: "Excellent" (represented by "○" in Table 2 and Table 4)

Surface where grain boundary etching occurred: "Poor" (represented by "x" in Table 2 and Table 4)

(5) Measurement of Etching Rate

Spray treatment was performed for 1 minute using a laminate with a rolled copper foil, which is the same one as in (2), under the same spray treatment conditions as those in (2) above to calculate the etching rate of the rolled copper foil by a weighing method based on the following formula.

$$\text{Etching rate } [\mu\text{m/min}] = \text{(mass [g] of rolled copper foil before roughening treatment} - \text{mass [g] of rolled copper foil after roughening treatment for 1 minute)/}\left(\text{roughening treatment area } [\text{m}^2] \times \langle\text{density of copper}\rangle 8.92\ [\text{g/cm}^3]\right)$$

Examples 2 to 17 and Comparative Examples 1 to 8

An aqueous composition for surface treatment of a rolled copper foil was prepared to subject the rolled copper foil to surface treatment in the same manner as in Example 1 except that the components described in Table 1 and Table 3 were used. The surface state parameters, Sa, Sz, Sq, Spc, and Sdr, improvement rate (unit: %) of each parameter, determined by the above formula (2), etching rate, and results of observation (evaluation of surface state) with a scanning electron microscope (SEM) of the rolled copper foil after the roughening treatment are shown in Table 2 and Table 4. As the alcohols, such as polyethylene glycol 600, and the azole compounds, reagents available from FUJIFILM Wako Pure Chemical Corporation, and the like were used.

TABLE 1

| Example No. | Composition | | | | | | | | |
|---|---|---|---|---|---|---|---|---|---|
| | Hydrogen peroxide (A) [wt %] | Sulfuric acid (B) [wt %] | Molar ratio of hydrogen peroxide/ sulfuric acid | Azole compound (C) [wt %] | | Alcohol [wt %] | | SP-MPU [wt %] | Cu [g/L] |
| Example 1 | 0.50 | 3.75 | 0.38 | 1H-Benzotriazole | 0.050 | Propylene glycol | 2.55 | 0.02 | 10 |
| Example 2 | 0.25 | 3.75 | 0.19 | 1H-Benzotriazole | 0.350 | Propylene glycol | 2.55 | 0.02 | 10 |
| Example 3 | 1.20 | 3.75 | 0.92 | 1H-Benzotriazole | 0.050 | — | — | 0.02 | 10 |
| Example 4 | 0.50 | 10.00 | 0.14 | 1H-Benzotriazole | 0.050 | — | — | 0.02 | 10 |
| Example 5 | 0.50 | 3.75 | 0.38 | 5-Methyl-bezotriazole | 0.050 | Propylene glycol | 2.55 | 0.02 | 10 |

TABLE 1-continued

| Example No. | Composition: Hydrogen peroxide (A) [wt %] | Sulfuric acid (B) [wt %] | Molar ratio of hydrogen peroxide/ sulfuric acid | Azole compound (C) [wt %] | | Alcohol [wt %] | | SP-MPU [wt %] | Cu [g/L] |
|---|---|---|---|---|---|---|---|---|---|
| Example 6 | 0.50 | 3.75 | 0.38 | 5-Methyltetrazole | 0.050 | Propylene glycol | 2.55 | 0.02 | 10 |
| Example 7 | 0.50 | 3.75 | 0.38 | 1H-Benzotriazole | 0.050 | 1,4-Butanediol | 2.55 | 0.02 | 10 |
| Example 8 | 0.50 | 3.75 | 0.38 | 1H-Benzotriazole | 0.050 | 1,5-Pentanediol | 2.55 | 0.02 | 10 |
| Example 9 | 0.50 | 3.75 | 0.38 | 1H-Benzotriazole | 0.050 | 2-(2-Butoxyethoxy) ethanol | 2.55 | 0.02 | 10 |
| Example 10 | 0.50 | 3.75 | 0.38 | 1H-Benzotriazole | 0.050 | 2-(2-Ethoxyethoxy) ethanol | 2.55 | 0.02 | 10 |
| Example 11 | 0.50 | 3.75 | 0.38 | 1H-Benzotriazole | 0.050 | Polyethylene glycol 600 | 2.55 | 0.02 | 10 |
| Example 12 | 0.50 | 3.75 | 0.38 | 1H-Benzotriazole | 0.050 | 1-Propanol | 2.55 | 0.02 | 10 |
| Example 13 | 0.50 | 3.75 | 0.38 | 1H-Benzotriazole | 0.050 | — | — | 0.02 | 10 |
| Example 14 | 0.50 | 3.75 | 0.38 | 1H-Bezotriazole-1-methanol | 0.050 | — | — | 0.02 | 10 |
| Example 15 | 0.50 | 3.75 | 0.38 | 1H-Tetrazole | 0.050 | — | — | 0.02 | 10 |
| Example 16 | 0.50 | 3.75 | 0.38 | 1H-Benzotriazole | 0.050 | — | — | — | 10 |
| Example 17 | 0.50 | 3.75 | 0.38 | 1H-Benzotriazole | 0.050 | — | — | 0.02 | — |

TABLE 2

| Example No. | Evaluation of surface state | Etching rate [um/min] | Surface state parameters: Sa [μm] | Sz [μm] | Sq [μm] | Spc [l/mm] | Sdr [—] | Evaluation of improvement rate: Sa [μm] | Sz [μm] | Sq [μm] | Spc [l/mm] | Sdr [—] |
|---|---|---|---|---|---|---|---|---|---|---|---|---|
| Example 1 | ○ | 0.64 | 0.29 | 5.45 | 0.39 | 6818 | 0.91 | A | A | A | A | A |
| Example 2 | ○ | 0.24 | 0.25 | 5.14 | 0.33 | 6661 | 0.83 | A | A | A | A | A |
| Example 3 | ○ | 2.44 | 0.22 | 3.73 | 0.28 | 5426 | 0.56 | B | C | B | A | A |
| Example 4 | ○ | 0.76 | 0.23 | 4.34 | 0.31 | 4884 | 0.52 | A | A | A | A | A |
| Example 5 | ○ | 0.59 | 0.25 | 4.84 | 0.33 | 7027 | 0.82 | A | A | A | A | A |
| Example 8 | ○ | 0.35 | 0.26 | 4.84 | 0.35 | 5492 | 0.65 | A | A | A | A | A |
| Example 7 | ○ | 0.22 | 0.23 | 4.61 | 0.32 | 5336 | 0.60 | A | A | A | A | A |
| Example 8 | ○ | 0.65 | 0.26 | 4.69 | 0.33 | 6350 | 0.76 | A | A | A | A | A |
| Example 9 | ○ | 0.51 | 0.34 | 8.42 | 0.47 | 12648 | 2.29 | A | A | A | A | A |
| Example 10 | ○ | 0.65 | 0.28 | 5.09 | 0.36 | 6129 | 0.77 | A | A | A | A | A |
| Example 11 | ○ | 0.59 | 0.28 | 4.73 | 0.35 | 7475 | 0.98 | A | A | A | A | A |
| Example 12 | ○ | 0.78 | 0.24 | 4.30 | 0.31 | 6505 | 0.76 | A | A | A | A | A |
| Example 13 | ○ | 0.55 | 0.26 | 4.99 | 0.36 | 6439 | 0.82 | A | A | A | A | A |
| Example 14 | ○ | 0.49 | 0.25 | 4.63 | 0.34 | 5915 | 0.73 | A | A | A | A | A |
| Example 15 | ○ | 0.30 | 0.27 | 5.15 | 0.36 | 7207 | 1.03 | A | A | A | A | A |
| Example 16 | ○ | 0.64 | 0.24 | 5.02 | 0.32 | 6022 | 6.71 | A | A | A | A | A |
| Example 17 | ○ | 0.41 | 0.26 | 5.35 | 0.35 | 6530 | 0.72 | A | A | A | A | A |

TABLE 3

| Comparative Example No. | Composition: Hydrogen peroxide (A) [wt %] | Sulfuric acid (B) [wt %] | Molar ratio of hydrogen peroxide/ sulfuric acid | Azole compound (C) [wt %] | | Alcohol [wt %] | | SP-MPU [wt %] | Cu [g/L] |
|---|---|---|---|---|---|---|---|---|---|
| Comparative Example 1 | 1.45 | 3.75 | 1.11 | 1H-Benzotriazole | 0.050 | — | — | 0.02 | 10 |
| Comparative Example 2 | 0.50 | 3.75 | 0.38 | — | — | Propylene glycol | 2.55 | 0.02 | 10 |
| Comparative Example 3 | 0.50 | 3.75 | 0.38 | — | — | — | — | 0.02 | 10 |
| Comparative Example 4 | 0.50 | 3.75 | 0.38 | Pyrazole | 0.050 | Propylene glycol | 2.55 | 0.02 | 10 |
| Comparative Example 5 | 0.50 | 3.75 | 0.38 | Imidazole | 0.050 | Propylene glycol | 2.55 | 0.02 | 10 |
| Comparative Example 6 | 0.50 | 3.75 | 0.38 | 3,5-Diamino-1,2,4-triazole | 0.050 | Propylene glycol | 2.55 | 0.02 | 10 |

TABLE 3-continued

| | Composition | | | | | | | | | |
|---|---|---|---|---|---|---|---|---|---|---|
| Comparative Example No. | Hydrogen peroxide (A) [wt %] | Sulfuric acid (B) [wt %] | Molar ratio of hydrogen peroxide/ sulfuric acid | Azole compound (C) [wt %] | | Alcohol [wt %] | | SP-MPU [wt %] | Cu [g/L] |
| Comparative Example 7 | 0.50 | 3.75 | 0.38 | 3-Amino-1,2,4-triazole | 0.050 | Propylene glycol | 2.55 | 0.02 | 10 |
| Comparative Example 8 | 0.50 | 3.75 | 0.38 | 1,2,4-Triazole | 0.050 | Propylene glycol | 2.55 | 0.02 | 10 |

TABLE 4

| | Evaluation | Etching | Surface state parameters | | | | | Evaluation of improvement rate | | | | |
|---|---|---|---|---|---|---|---|---|---|---|---|---|
| Comparative Example No. | of surface state | rate [um/min] | Sa [μm] | Sz [μm] | Sq [μm] | Spc [l/mm] | Sdr [—] | Sa [μm] | Sz [μm] | Sq [μm] | Spc [l/mm] | Sdr [—] |
| Comparative Example 1 | ○ | 3.55 | 0.20 | 3.84 | 0.25 | 4890 | 0.45 | D | B | D | A | B |
| Comparative Example 2 | ○ | 1.61 | 0.14 | 2.58 | 0.18 | 1402 | 0.05 | D | D | D | D | D |
| Comparative Example 3 | ○ | 1.30 | 0.14 | 2.50 | 0.18 | 1292 | 0.05 | D | D | D | D | D |
| Comparative Example 4 | x | 0.39 | 0.15 | 2.82 | 0.19 | 1372 | 0.06 | D | D | D | D | D |
| Comparative Example 5 | ○ | 0.77 | 0.14 | 2.72 | 0.19 | 2132 | 0.10 | D | D | D | C | D |
| Comparative Example 6 | x | 0.16 | 0.17 | 3.37 | 0.22 | 2260 | 0.13 | D | D | D | C | C |
| Comparative Example 7 | x | 0.27 | 0.13 | 2.05 | 0.17 | 700 | 0.02 | D | D | D | D | D |
| Comparative Example 8 | ○ | 0.35 | 0.13 | 2.40 | 0.17 | 1049 | 0.05 | D | D | D | D | D |

According to the aqueous composition of the present invention and the method for subjecting a rolled copper foil to roughening treatment using the aqueous composition, it is possible to obtain a rolled copper foil having an excellent roughened shape even when etching amount is low, the roughened shape free from the occurrence of a crater-like shape or a pit.

INDUSTRIAL APPLICABILITY

The rolled copper foil obtained by the present invention has a roughened surface free from the occurrence of a crater-like shape or a pit and having particular roughening parameters and can suitably be used for a flexible printed circuit board and the like.

The invention claimed is:

1. An aqueous composition for roughening a surface of a rolled copper foil, the aqueous composition comprising:

hydrogen peroxide (A);

sulfuric acid (B); and an azole compound (C) and/or a salt thereof, wherein a content of hydrogen peroxide (A) in the aqueous composition is 0.1 to 5% by mass based on a total mass of the aqueous composition, a content of sulfuric acid (B) in the aqueous composition is 0.5 to 15% by mass based on the total mass of the aqueous composition, a content of the azole compound (C) and/or the salt thereof in the aqueous composition is 0.01 to 0.3% by mass based on the total mass of the aqueous composition, a molar ratio between hydrogen peroxide (A) and sulfuric acid (B) in the aqueous composition is in a range of 0.1 to 1.0 expressed by a ratio of hydrogen peroxide/sulfuric acid, and the azole compound (C) is at least one selected from the group consisting of a benzotriazole compound and a tetrazole compound, wherein said aqueous composition is free of chloride ion.

2. The aqueous composition according to claim 1, wherein the azole compound (C) is at least one selected from the group consisting of a benzotriazole compound represented by formula (I) and a tetrazole compound represented by formula (II):

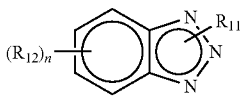

(I)

wherein $R_{11}$ is selected from the group consisting of H (hydrogen), substituted or unsubstituted C1-4 alkyl, hydroxy (C1-4 alkyl), aryl having 20 or less carbon atoms, carboxy, carbonyl, alkoxy having 10 or less carbon atoms, sulfo, phosphine, and nitro, each of $R_{12}$ is independently selected from the group consisting of H (hydrogen), substituted or unsubstituted C1-4 alkyl, hydroxy (C1-4 alkyl), aryl having 20 or less carbon atoms, carboxy, carbonyl, alkoxy having 10 or less carbon atoms, sulfo, phosphine, and nitro, and n is an integer of 1 to 4;

(II)

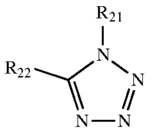

wherein $R_{21}$ is selected from the group consisting of H (hydrogen), substituted or unsubstituted C1-4 alkyl, hydroxy (C1-4 alkyl), aryl having 20 or less carbon atoms, carboxy, carbonyl, alkoxy having 10 or less carbon atoms, sulfo, phosphine, and nitro, and $R_{22}$ is selected from the group consisting of H (hydrogen), substituted or unsubstituted C1-4 alkyl, hydroxy (C1-4 alkyl), aryl having 20 or less carbon atoms, carboxy, carbonyl, alkoxy having 10 or less carbon atoms, sulfo, phosphine, and nitro.

3. The aqueous composition according to claim 2, wherein the azole compound (C) is at least one selected from the group consisting of 1H-benzotriazole, 5-methylbenzotriazole, 1H-benzotriazole-1-methanol, 5-methyl-1H-tetrazole, and 1H-tetrazole.

4. The aqueous composition according to claim 1, further comprising:

phenylurea, wherein a content of phenylurea in the aqueous composition is 0.005 to 0.3% by mass based on the total mass of the aqueous composition.

5. The aqueous composition according to claim 1, wherein when a surface of a rolled copper foil before roughening treatment having surface state parameters, Sa, Sz, Sq, Spc, and Sdr, specified by ISO 25178, satisfying the following condition, is subjected to the roughening treatment by 0.5 to 1.0 μm expressed in terms of roughening treatment amount in μm determined by the following formula (1) under a condition of 35° C., an improvement rate expressed in % of each parameter, determined by the following formula (2), in the surface state parameters, Sa, Sz, Sq, Spc, and Sdr, for the roughening-treated rolled copper foil is 30% or more for all the surface state parameters:

the surface state parameters of the rolled copper foil before the roughening treatment:

Sa: 0.15±2.0% [μm]

Sz: 2.67±2.0% [μm]

Sq: 0.20±2.0% [μm]

Spc: 1569±2.0% [1/mm]

Sdr: 0.09±2.0% [−];

Roughening treatment amount [μm] = (mass [g] of rolled copper foil before roughening treatment − mass [g] of rolled copper foil after roughening treatment)/(roughening treatment area [$m^2$] × density of copper) Formula (1), where the density of copper is 8.92 g/$cm^3$;

-continued

Improvement rate [%] = (numerical value of a parameter after roughening treatment − numerical value of a parameter before roughening treatment)/numerical value of a parameter before roughening treatment × 100. Formula (2)

6. The aqueous composition according to claim 1, further comprising:

an alcohol.

7. A method for subjecting a rolled copper foil to roughening treatment, the method comprising:

bringing the aqueous composition according to claim 1 and a surface of the rolled copper foil into contact with each other to roughen the surface of the rolled copper foil.

8. The method according to claim 7, wherein when the surface of the rolled copper foil is subjected to the roughening treatment by 0.5 to 1.0 μm expressed in terms of roughening treatment amount in μm determined by the following formula (1) under a condition of 35° C., an improvement rate expressed in % of each parameter, represented by the following formula (2), the improvement rate being a ratio of each numerical value of surface state parameters, Sa, Sz, Sq, Spc, and Sdr, specified by ISO 25178 of the surface of the rolled copper foil after the roughening treatment to each numerical value of the surface state parameters, Sa, Sz, Sq, Spc, and Sdr, specified by ISO 25178 of the surface of the rolled copper foil before the roughening treatment, is 30% or more for all the surface state parameters:

Roughening treatment amount [μm] = (mass [g] of rolled copper foil before roughening treatment − mass [g] of rolled copper foil after roughening treatment)/(roughening treatment area [$m^2$] × density of copper) Formula (1), where the density of copper is 8.92 g/$cm^3$;

Improvement rate [%] = (numerical value of a parameter after roughening treatment − numerical value of a parameter before roughening treatment)/numerical value of a parameter before roughening treatment × 100. Formula (2)

9. A method for producing a roughening-treated rolled copper foil, the method comprising:

bringing the aqueous composition according to claim 1 and a surface of a rolled copper foil into contact with each other to roughen the surface of the rolled copper foil.

10. The method according to claim 9, wherein when the surface of the rolled copper foil is subjected to roughening treatment by 0.5 to 1.0 μm expressed in terms of roughening treatment amount in μm determined by the following formula (1) under a condition of 35° C., an improvement rate expressed in % of each parameter, represented by the following formula (2), the improvement rate being a ratio of each numerical value of surface state parameters, Sa, Sz, Sq, Spc, and Sdr, specified by ISO 25178 of the surface of the rolled copper foil after the roughening treatment to each numerical value of the surface state parameters, Sa, Sz, Sq, Spc, and Sdr, specified by ISO 25178 of the surface of the rolled copper foil before the roughening treatment, is 30% or more for all the surface state parameters:

$$\text{Roughening treatment amount } [\mu m] = (\text{mass } [g] \text{ of rolled copper foil before roughening treatment} - \text{mass } [g] \text{ of rolled copper foil after roughening treatment}) / (\text{roughening treatment area } [m^2] \times \text{density of copper}) \quad \text{Formula (1),}$$

where the density of copper is 8.92 $g/cm^3$;

$$\text{Improvement rate } [\%] = (\text{numerical value of a parameter after roughening treatment} - \text{numerical value of a parameter before roughening treatment}) / \text{numerical value of a parameter before roughening treatment} \times 100. \quad \text{Formula (2)}$$

11. The method according to claim 9, wherein the roughening-treated rolled copper foil is a rolled copper foil for a flexible printed circuit board.

12. A rolled copper foil obtained by subjecting a surface thereof to a roughening treatment using the aqueous composition according to claim 1.

13. The rolled copper foil according to claim 12, wherein when the surface of the rolled copper foil is subjected to the roughening treatment by 0.5 to 1.0 μm expressed in terms of roughening treatment amount in μm determined by the following formula (1) under a condition of 35° C., an improvement rate expressed in % of each parameter, represented by the following formula (2), the improvement rate being a ratio of each numerical value of surface state parameters, Sa, Sz, Sq, Spc, and Sdr, specified by ISO 25178 of the surface of the rolled copper foil after the roughening treatment to each numerical value of the surface state parameters, Sa, Sz, Sq, Spc, and Sdr, specified by ISO 25178 of the surface of the rolled copper foil before the roughening treatment, is 30% or more for all the surface state parameters:

$$\text{Roughening treatment amount } [\mu m] = (\text{mass } [g] \text{ of rolled copper foil before roughening treatment} - \text{mass } [g] \text{ of rolled copper foil after roughening treatment}) / (\text{roughening treatment area } [m^2] \times \text{density of copper}) \quad \text{Formula (1),}$$

where the density of copper is 8.92 $g/cm^3$;

$$\text{Improvement rate } [\%] = (\text{numerical value of a parameter after roughening treatment} - \text{numerical value of a parameter before roughening treatment}) / \text{numerical value of a parameter before roughening treatment} \times 100. \quad \text{Formula (2)}$$

14. A flexible printed circuit board formed using a roughened copper foil produced by the method according to claim 9.

15. An aqueous composition for roughening a surface of a rolled copper foil, the aqueous composition comprising:

hydrogen peroxide (A);

sulfuric acid (B); and an azole compound (C) and/or a salt thereof, wherein a content of hydrogen peroxide (A) in the aqueous composition is 0.1 to 5% by mass based on a total mass of the aqueous composition, a content of sulfuric acid (B) in the aqueous composition is 0.5 to 15% by mass based on the total mass of the aqueous composition, a content of the azole compound (C) and/or the salt thereof in the aqueous composition is 0.01 to 0.3% by mass based on the total mass of the aqueous composition, a molar ratio between hydrogen peroxide (A) and sulfuric acid (B) in the aqueous composition is in a range of 0.1 to 1.0 expressed by a ratio of hydrogen peroxide/sulfuric acid, and the azole compound (C) is at least one selected from the group consisting of a benzotriazole compound and a tetrazole compound, wherein said aqueous composition is free of halide ion.

* * * * *